United States Patent
Yun

(10) Patent No.: US 7,274,196 B2
(45) Date of Patent: Sep. 25, 2007

(54) APPARATUS AND METHOD FOR TESTING ELECTRICAL CHARACTERISTICS OF SEMICONDUCTOR WORKPIECE

(75) Inventor: Byong-Hui Yun, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 31 days.

(21) Appl. No.: 11/296,655

(22) Filed: Dec. 7, 2005

(65) Prior Publication Data
US 2006/0145717 A1      Jul. 6, 2006

(30) Foreign Application Priority Data
Dec. 7, 2004    (KR) .............................. 2004-102545

(51) Int. Cl.
*G01R 31/02* (2006.01)
(52) U.S. Cl. .................................. 324/754
(58) Field of Classification Search ............... None
See application file for complete search history.

(56) References Cited

U.S. PATENT DOCUMENTS 5,371,654 A * 12/1994 Beaman et al. ............. 361/744
5,521,522 A *  5/1996 Abe et al. ................... 324/758
6,252,415 B1 *  6/2001 Lefever et al. ............. 324/761

FOREIGN PATENT DOCUMENTS

| JP | 06-216205 | 8/1994 |
|---|---|---|
| JP | 11-064440 | 3/1999 |
| JP | 2004-212233 | 7/2004 |
| KR | 1997-046792 | 7/1997 |

\* cited by examiner

*Primary Examiner*—Paresh Patel
(74) *Attorney, Agent, or Firm*—F. Chau & Assoc., LLC

(57) ABSTRACT

An apparatus for testing electrical characteristics of a semiconductor workpiece includes a probe card having probes and signal pads electrically connected to the probes, wherein the probes are in contact with a workpiece during a test process; a test head electrically connected with a performance board having signal pads; and a pogo module having pogo pins for electrically connecting the signal pads of the probe card with the signal pads of the performance board during a test process, wherein at least two the pogo pins are electrically connected in parallel to one of the signal pads of the probe card, and wherein at least two pogo pins are electrically connected in parallel to one of the signal pads of the performance board. A resistance caused by the pogo pins is lowered to test the electrical characteristics of a semiconductor workpiece more precisely and a test process is performed even when one of the pogo pins is in poor contact with a pad.

10 Claims, 6 Drawing Sheets

APPARATUS AND METHOD FOR TESTING ELECTRICAL CHARACTERISTICS OF SEMICONDUCTOR WORKPIECE

CROSS-REFERENCE TO RELATED APPLICATIONS

This application claims priority to Korean Patent Application No. 2004-102545, filed on Dec. 7, 2004, the disclosure of which is herein incorporated by reference in its entirety.

BACKGROUND OF THE INVENTION

1. Field of the Invention

The present invention relates to an apparatus and a method for testing a workpiece and, more particularly, to an apparatus and a method for testing electrical characteristics of a semiconductor chip.

2. Description of Related Art

Semiconductor device manufacturing involves many process and testing steps. In general, testing is performed to determine whether the semiconductor device's electrical characteristics conform to its design specifications. Typically, the testing is carried out by contacting pads on the semiconductor devices with one or more testing apparatus.

For example, semiconductor integrated circuits are typically tested in wafer form before they are packaged. Each wafer may undergo a suite of tests immediately after production to separate non-defective wafers from defective ones.

An example of a test apparatus for electrically examining semiconductor integrated circuits (or chips) is disclosed in U.S. Pat. No. 6,118,290. A semiconductor test apparatus typically includes a chuck for supporting a wafer, a performance board and a probe card. The probe card has probe contactors (such as cantilevers or needles) for contacting the contact pads on the chips. The test head is disposed on an upper portion of the test apparatus. The test head and probe card are electrically connected through an interface component comprising the performance board and a pogo module. The performance board, which is mounted on the test head, is a printed circuit board having electric circuit connections unique to a test head's electrical footprint. The pogo module, which includes a large number pogo pins, is disposed between the probe card and the performance board.

FIG. 1A and FIG. 1B are cross-sectional views of a pogo module of a conventional test apparatus. Referring to FIGS. 1A and 1B, pads 922 and 942 of a probe card 920 and a performance board 940, respectively, are electrically interconnected by a pogo pin 962. If the pogo pin 962 extends insufficiently from a pogo module 960 such that contact is not made with a pad 942, as shown in FIG. 1A, or if foreign substances are attached to a portion of the pad 942 such that there is poor contact with the pogo pin 962, as shown in FIG. 1B, then a normal test can not be conducted. In addition, long-term use of the pogo pins leads to increased contact resistance. In the case where only one pogo pin 962 is used, a higher resistance makes it difficult to precisely measure the electrical characteristics of a chip.

SUMMARY OF THE INVENTION

Exemplary embodiments of the present invention are directed to apparatuses and methods for testing electrical characteristics of a semiconductor workpiece.

In an exemplary embodiment of the present invention, an apparatus for testing electrical characteristics of a semiconductor workpiece includes a probe card having probes and signal pads electrically connected to the probes, wherein the probes are in contact with the workpiece during a test process; a test head electrically connected to a performance board having signal pads; and a pogo module having pogo pins for electrically connecting the signal pads of the probe card with the signal pads of the performance board during a test process, wherein at least two pogo pins are electrically connected in parallel to one of the signal pads of the probe card, and wherein at least two pogo pins are electrically connected in parallel to one of the signal pads of the performance board.

In another exemplary embodiment of the present invention, an apparatus for testing electrical characteristics of a semiconductor workpiece includes a chamber; a chuck for supporting a workpiece, wherein the chuck is disposed in the chamber and movable vertically and horizontally; and a test unit disposed on the chamber for testing electrical characteristics of the workpiece. The test unit includes a probe card having probes and signal pads electrically connected to the probes, wherein the probes are in contact with a workpiece during a test process; a test head electrically connected with a performance board having signal pads, wherein the test head applies an electrical signal to the respective signal pads of the performance board to measure electrical characteristics of the workpiece; and a pogo module having pogo pins for electrically connecting the signal pad of the probe card with the signal pad of the performance board during a test process, wherein at least two pogo pins are electrically connected in parallel to one of the signal pads of the probe card, and wherein at least two pogo pins are electrically connected in parallel to one of the signal pads of the performance board.

In an exemplary embodiment of the present invention, a method of testing electrical characteristics of a semiconductor workpiece includes providing a probe card having pads; providing a performance board having pads; and providing a plurality of pogo pins with at least two pogo pins being electrically connected in parallel to one of the pads of the probe card and at least two pogo pins being electrically connected in parallel to one of the pads of the performance board.

In another exemplary embodiment of the present invention, a method of testing electrical characteristics of a semiconductor workpiece includes providing a probe card having signal pads and ground pads; providing a performance board having signal pads and ground pads; providing at least two pogo pins connected in parallel to the signal pads of the probe card and the signal pads of the performance board to electrically interconnect the signal pads of the probe card and the signal pads of the performance board respectively; and providing at least one pogo pin for electrically connecting the ground pad of the probe card with the ground pad of the performance board.

BRIEF DESCRIPTION OF THE DRAWINGS

The present invention will become more apparent to those of ordinary skill in the art when descriptions of exemplary embodiments thereof are read with reference to the accompanying drawings, of which.

DETAILED DESCRIPTION OF THE EXEMPLARY EMBODIMENTS

Figure 1A:
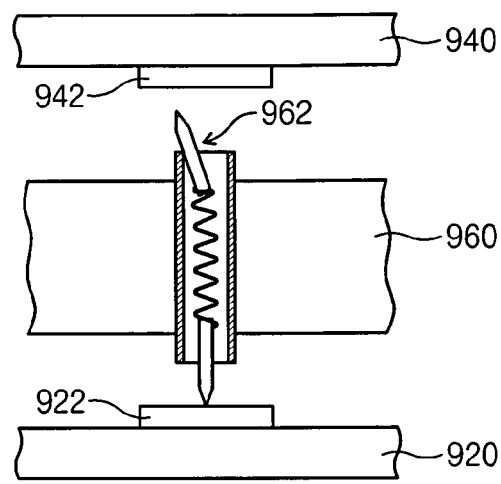
FIG. 1A and FIG. 1B are cross-sectional views of a pogo module of a conventional test apparatus.

Hereinafter, the exemplary embodiments of the present invention will be described in detail with reference to the accompanying drawings. In the drawings, the size and relative sizes of layers and regions may be exaggerated for clarity.

Figure 2:
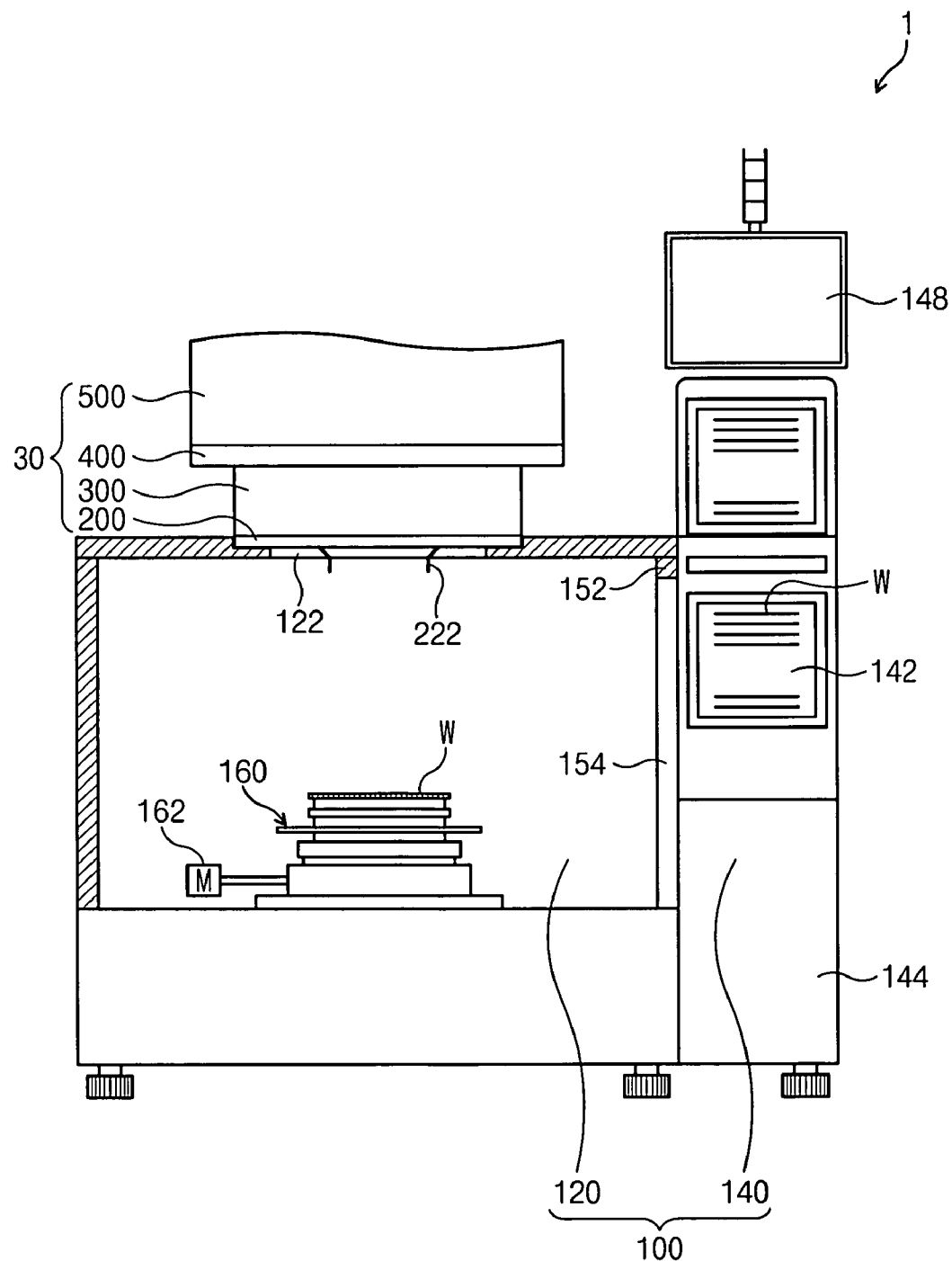
FIG. 2 illustrates a test apparatus according to an exemplary embodiment of the present invention.

FIG. 2 illustrates a test apparatus according to an exemplary embodiment of the present invention. Referring to FIG. 2, a test apparatus 1 includes a chamber 100, a chuck 160, and a test unit 30. The chamber 100 includes a rectangular parallelepiped body formed to enclose an interior volume. The interior volume of the chamber 100 includes a processing section 120 in which chips, either in wafer or die form, are tested, and a loader section 140 in which chips, either in wafer or die form, are aligned and loaded/unloaded to/from the chuck 160. The processing section 120 and the loader section 140 are disposed abreast one another.

As shown in FIG. 2, a chip transfer path 154 is provided to a partition 152, which is disposed between the processing section 120 and the loader section 140. An opening 122 is formed in a surface of the top portion of the chamber 100. A probe card 200, embodiments of which will be described in detail later in this disclosure, is mounted to traverse the opening 122. A door (not shown) may be installed at the front of the chamber 100, for example, for facilitating maintenance of structures mounted in the processing section 120. A chip, either in wafer or die form is placed on a chuck 160, which is movable in X, Y, Z and θ directions by means of a chuck driver. To load/unload chips, the chuck 160 moves between the processing section 120 and the loader section 140 along the chip transfer path. During a test process, the chuck 160 moves in an X, Y, Z or θ direction to position a chip test area in contact with a probe 220 of the probe card 200.

A cassette, which is sized to accommodate a wafer W, for example, is placed on a plate 142 disposed at one side in the loader section 140. It is to be understood that the cassette may be sized to accommodate various chips, either in wafer or die form. An aligner (not shown) is configured for aligning the wafer W. A transfer robot (not shown) may be installed at the loader section 140 for transferring a wafer W to the aligner from the cassette and transferring the wafer W to the chuck 160. A controller 146 controls the chuck driver 162 for moving the chuck 160 and the robot driver (not shown) for driving the transfer robot. Operators may handle the controller 146 using a handle panel 148.

Figure 3:
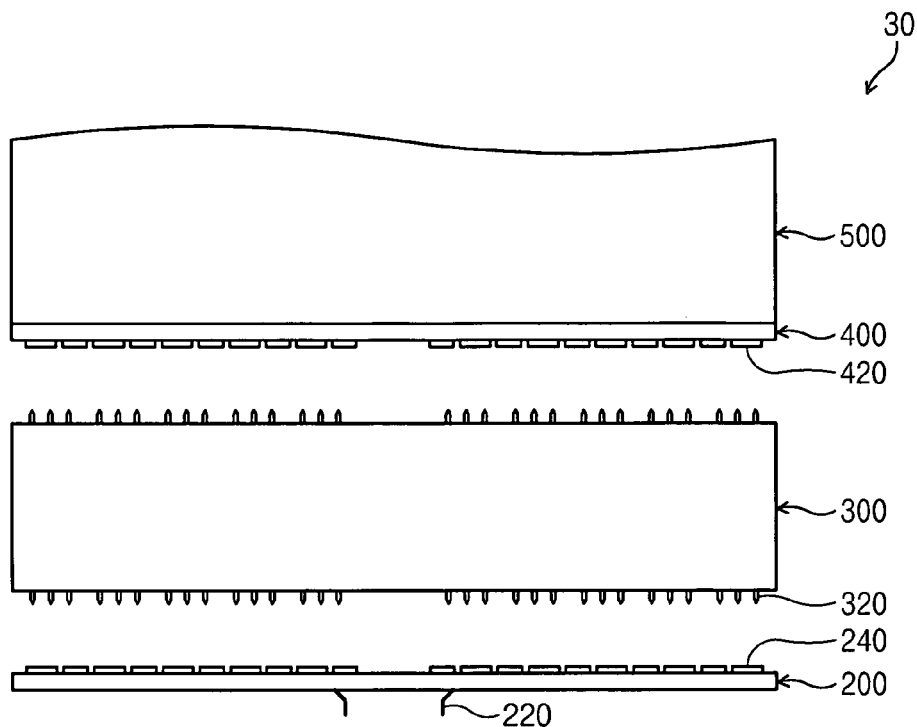
FIG. 3 is an exploded view of the components of a test unit shown in FIG. 2.

The test unit 30 applies an electrical signal to a chip, for example, a chip in wafer form, to test electrical characteristics of the chip. During a test process, the test unit 30 is disposed on the processing unit 120. FIG. 3 shows a configuration of the test unit 30, according to an exemplary embodiment of the present invention. Referring to FIG. 3, test unit 30 includes a probe card 200, a pogo module 300, and a test head 500. The probe card 200 is mounted to traverse an opening 122 in a surface of the top portion of the chamber 100. The probe card 200 comprises at least one printed circuit board (PCB). Probes 220 are formed on a bottom surface of the probe card 200, and pads 240 are formed on a top surface thereof. The probes 220 extend downwardly, and the pads 240 are electrically connected to the probes 220. During the test process, the probe 220 is in contact with a pad (not shown) formed on a chip. Electrical interconnect patterns (not shown) are formed at the probe card 200 for electrically interconnecting the probe 200 and the pads 240.

The test head 500 shown in FIGS. 2 and 3 is rotatable on the chamber 100 of FIG.2. A performance board 400 is mounted on a bottom surface of the test head 500. The performance board 400 includes at least one PCB. Pads are formed on a bottom surface of the PCB. The pads formed on the chip, the pads 240 formed on the probe card 200, and the pads 420 formed at the performance board 400 comprise a conductive material such as copper, aluminum, or gold. It will be understood that any conductive material for forming the pads should be suitable for implementing the present invention. The pads 420 formed at the performance board 400 are disposed opposite to the pads 240 formed on the probe card 200. The pads 420 may have the same shape as the pads 240. An electrical measuring instrument (not shown) is disposed at the test head 500 for applying an electrical signal to the pad 420 to measure electrical characteristics of a workpiece.

Figure 5:
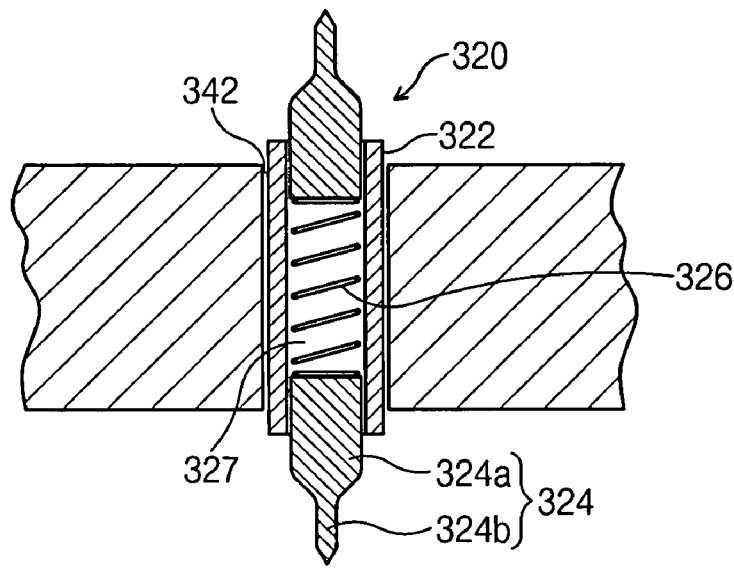
FIG. 5 is a cross-sectional view of a pogo pin shown in FIG. 3, according to an exemplary embodiment of the present invention.

The pogo module 300 is disposed between the performance board 400 and the probe card 200 to electrically connect the pads 420 with the pads 240. The pogo module may be fixedly installed on the chamber 100 or the test head 500. The pogo module 340 has a pogo block 340 and pogo pins 320. The pogo block 340 supports the pogo pins 320 and is configured, for example, as a cylindrical block having a plurality of holes formed therein, as shown in FIG. 5.

The pads 420 and the pads 240 may be classified into pads connected to a positive terminal of an electrical measuring instrument and pads connected to a negative terminal thereof. Hereinafter, pads connected to a positive terminal of an electrical measuring instrument will be referred to as signal pads 240a and 420a, and pads connected to a negative terminal thereof will be referred to as ground pads 240b and 420b.

Hereinafter, a pogo pin 320a interconnecting the signal pads 240a and 420a will be referred to as a signal pin, and a pogo pin 320b interconnecting the ground pads 240b and 420b will be referred to as a ground pin. Electrical interconnect patterns may be formed on a PCB of the performance board 400 or the probe card 200 for electrically interconnecting the ground pads 240b and 420b.

Figure 4:
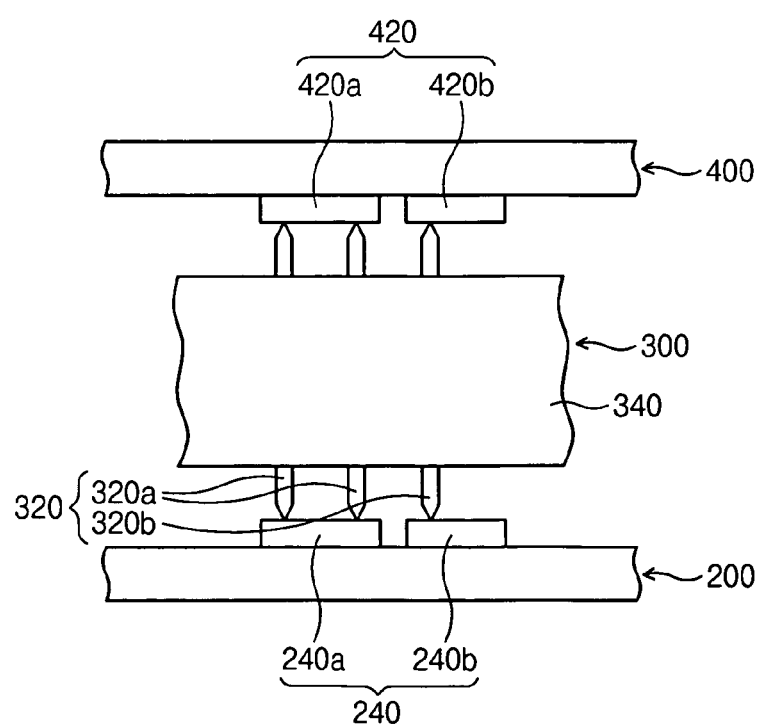
FIG. 4 illustrates signal pads in contact with pogo pins of FIG. 3.

FIG. 4 illustrates connection of signal panels with pogo pins shown in FIG. 3. Referring to FIG. 4, a signal pad 420a of a performance board 400 is electrically connected to a signal pad 240a of a probe card 200 by two signal pins 320a. A ground pad 420b of the performance board 400 is electrically connected to a ground pad 240b of the probe card 200 by means of one ground pin 320b. The signal pins 320a are disposed in parallel and electrically couple the signal pads 240a and 420a in parallel. According to an exemplary embodiment of the present invention, each of the signal pins 320a and the ground pin 320b have the same shape and configuration.

FIG. 5 is a cross-sectional view of a pogo pin shown in FIG. 3, according to an exemplary embodiment of the present invention. Referring to FIG. 5, a pogo pin 320 includes a case 322, contact pins 324, and an elastic member 326. For example, the case 322 may be a pipe-type case with insertion holes 327 formed at its center. The case 322 is disposed in a hole 342 formed in a pogo block 340. The contact pins 324 are at least partially disposed in the respective ends of the insertion hole 327. The contact pins 324 are coupled with each other by means of the elastic member 326 provided in the insertion hole 327. The elastic member 326 may be a spring. Each of the contact pins 324 is disposed in the insertion hole 327 and includes a coupling portion 324a and a contact portion 324b. The coupling portion 324a is a cylindrical portion that is disposed in the insertion hole 327 and coupled with the elastic member 326. The contact portion 324b extends from the coupling section 324a outwardly toward the coupling portion 324a and is in contact with pads 240 and 420. The contact pings 324 and the elastic member 326 comprise conductive materials, and the case 322 comprises a non-conductive material. For example, the contact pin 324 may comprise a gold-plated copper, and the elastic member 326 may comprise SUS or iron. During a test process, the elastic member 326 is compressed by a pressing force of the test head 500, and an electrical signal provided from an electrical measuring instrument flows to a pad of a semiconductor chip through a pad 420 of the performance board 400, pogo pin 320, pad 240 of the probe card 200, and probe 220 of the probe card 200.

Figure 6:
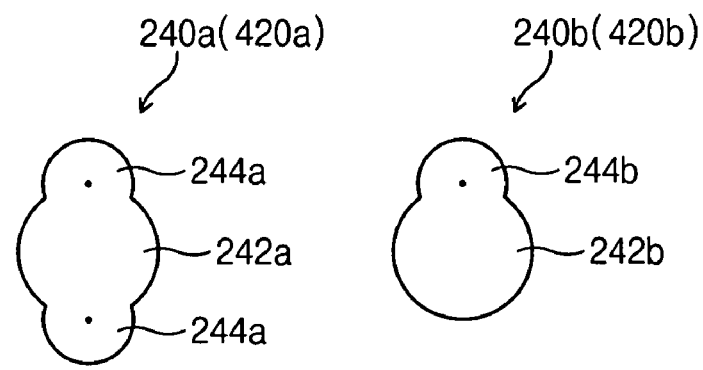
FIG. 6 illustrates exemplary shapes of signal and ground pads shown in FIG. 3.

FIG. 6 shows exemplary shapes of signal pads 240a and 420a and ground pads 240b and 420b. Each of the signal pads 240a and 420a has a central portion 242a disposed at its center and a pair of contact portions 244a extending from the central portion 242a. The central portion 242a is a center-blowing portion, and each of the contact portions 244a is a semicircular portion. A signal pin 320a is in contact with the center of the contact portion 244a. Each of the ground pads 240b and 420b has a central portion 242b and a contact portion 244b extending from the central portion 240b. The central portion 242b has a circular shape, and the contact portion 244b has a semi-circular shape. A ground pin 320b is in contact with the center of the contact portion 244b.

Figure 1B:
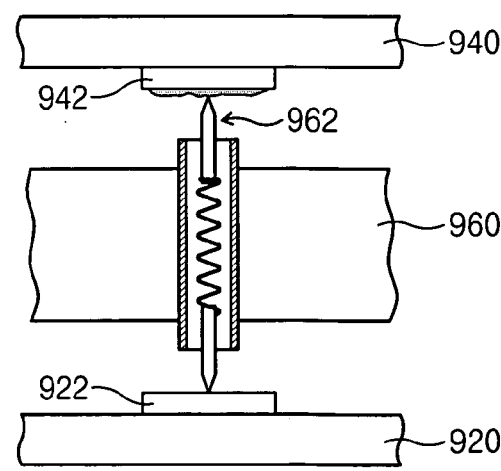

A large number of signal pads 240a and 420a, for example, hundreds of signal pads 240a and 420a, are provided to a performance board 400 and a probe card 200 for testing electrical characteristics of a semiconductor chip. In the test apparatus 1 shown in FIG. 1, signal pads of a performance board 400 and a probe card 200 are electrically interconnected by one pogo pin 320. In this case, if a pogo pin 320 insufficiently extends from the case 322, for example, due to long-term use of the test apparatus 1 or because foreign substances are attached to a contact portion of signal pads 240a and 420a and the pogo pin 320, the pogo pin 320 is not in contact (or is in poor contact) with the signal pads 240a and 420a. Under such conditions, a normal test can not be performed. However, according to embodiments of the present invention, the respective signal pads of the performance board 400 and the probe card 200 are electrically interconnected by a pair of pogo pins 320. In the event that one of the pogo pins 320 is in poor contact with the signal pads 240a and 420a, the other pogo pin 320, the signal pads 240a and 420a are electrically interconnected by the other pogo pin 320 to enable a normal test to be conducted.

Figure 7A:
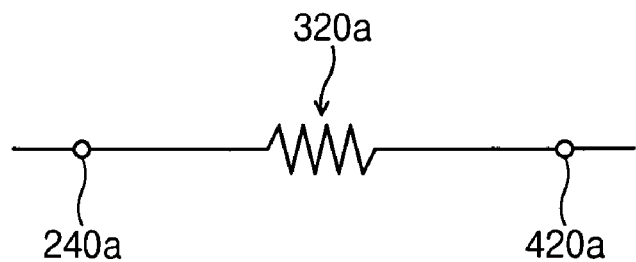
FIG. 7A is a circuit diagram showing a resistor of a conventional test apparatus.
Figure 7B:
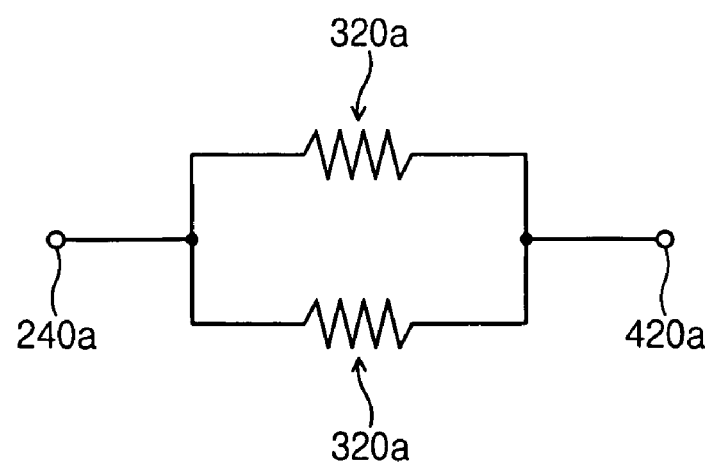
FIG. 7B is a circuit diagram showing a resistor of a test apparatus, according to an exemplary embodiment of the present invention.

A resistor preferably has a low resistance to measure electrical characteristics precisely, such as when measuring a high current or a high voltage. For example, if a resistor having a resistance value of 'R' (see FIG. 7A) when one signal pin is used, a resistor decreases to resistance value of 'R/2' (see FIG. 7B) when two signal pins are used in parallel. When the test apparatus 1, according to exemplary embodiments of the present invention, is used, electrical characteristics of a semiconductor chip may be measured more precisely than when a conventional test apparatus is used.

Figure 8A:
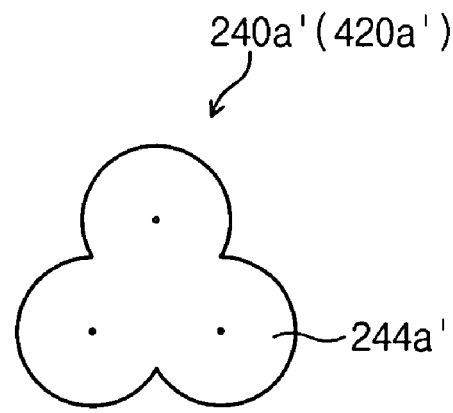
FIG. 8A and FIG. 8B illustrate other examples of a signal pad, according to exemplary embodiments of the present invention.
Figure 8B:
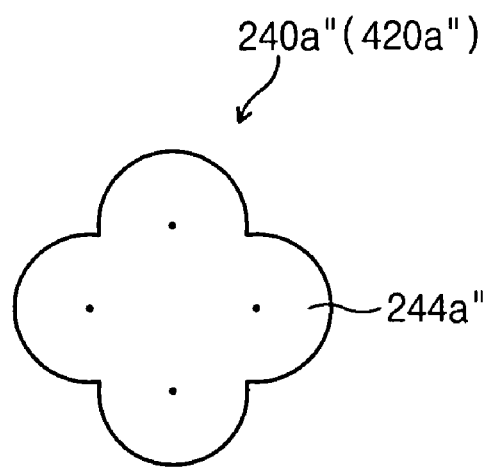

As described above, signal pads 240a and 420a of a probe card 200 and a performance board 400 are electrically interconnected by two pogo pins 320. It is to be understood that the signal pads 240a and 420a may be electrically interconnected by three or more pogo pins 320 disposed in parallel. For example, if three pogo pins 320 are provided for electrically interconnecting signal pads 240a' and 420a' of a probe card 200 and a performance board 400, each of the signals pads 240a' and 420a' may have contact portions 244a' disposed to form angles of 120 degrees (see FIG. 8A). If four pogo pins 320 are provided for electrically signal pads 240a" and 420a" of a performance board 400 and a probe card 200, each of the signal pads 240a" and 420a" may have contact portions 244a" disposed to form angles of 90 degrees (see FIG. 8B).

As described above, ground pads 420b and 240b of a performance board 400 and a probe card 200 are electrically interconnected by one pogo pin 320. However, it is to be understood that the ground pads 420b and 240b may be electrically interconnected by a plurality of pogo pins disposed in parallel.

Although exemplary embodiments of the present invention have been described in detail with reference to the accompanying drawings for the purpose of illustration and description, it is to be understood that the inventive processes and apparatus are not to be construed as thereby. It will be apparent to those of ordinary skill in the art that various modifications to the foregoing exemplary embodiments may be made without departing from the scope of the invention as defined by the appended claims, with equivalents of the claims to be included therein.

What is claimed is:

1. An apparatus for testing electrical characteristics of a semiconductor workpiece, comprising:
   a probe card having probes and signal pads electrically connected to the probes, wherein the probes are in contact with the workpiece during a test process;
   a test head electrically connected to a performance board having signal pads; and
   a pogo module having pogo pins for electrically connecting the signal pads of the probe card with the signal pads of the performance board during a test process, wherein the at least two pogo pins are electrically connected in parallel to one of the signal pads of the probe card, and wherein at least two pogo pins are electrically connected in parallel to one of the signal pads of the performance board.

2. The apparatus of claim 1, wherein the pogo module further comprises a pogo block having a plurality of holes formed therein, the pogo block supporting the pogo pins,
   wherein each of the pogo pins comprises:
      a case disposed in one of the holes formed in the pogo block;

a first contact pin at least partially disposed in the case and configured to make contact with one of the signal pads of the performance board during a test process;

a second contact pin at least partially disposed in the case and configured to make contact with one of the signal pads of the probe card during a test process; and an elastic member for electrically connecting the first contact pin with the second contact pin.

3. The apparatus of claim 1, wherein during a test process each of the respective signal pads of the performance board and the probe card comprise a first contact portion and a second contact portion disposed opposite to the first contact portion, wherein a first pogo pin is in contact with the first contact portion and a second pogo pin is in contact with the second contact portion.

4. The apparatus of claim 1, wherein the at least two pogo pins for electrically connecting the respective signal pads of the performance board with the respective signal pads of the probe card have the same shape and are disposed abreast one another.

5. An apparatus for testing electrical characteristics of a semiconductor workpiece, comprising:
a chamber;
a chuck for supporting a workpiece, wherein the chuck is disposed in the chamber and movable vertically and horizontally; and
a test unit disposed on the chamber for testing electrical characteristics of the workpiece,
wherein the test unit comprises:
a probe card having probes and signal pads electrically connected to the probes, wherein the probes are in contact with a workpiece during a test process;
a test head electrically connected with a performance board having signal pads, wherein the test head applies an electrical signal to the respective signal pads of the performance board to measure electrical characteristics of the workpiece; and
a pogo module having pogo pins for electrically connecting the signal pads of the probe card with the signal pads of the performance board during a test process, wherein at least two pogo pins are electrically connected in parallel to one of the signal pads of the probe card, and wherein at least two pogo pins are electrically connected in parallel to one of the signal pads of the performance board.

6. The apparatus of claim 5, wherein the respective signal pads of the performance board and the probe card have a first contact portion and a second contact portion, and wherein one of the pogo pins is in contact with the first contact portion disposed at one side, and wherein the other pogo pin is in contact with the second contact portion disposed at an opposite side of the first contact portion.

7. The apparatus of claim 5, wherein the pogo pins provided for electrically connecting the respective signal pads of the performance board with the respective signal pads of the probe card have the same shape and are disposed abreast one another.

8. A method of testing electrical characteristics of a semiconductor workpiece, comprising:
providing a probe card having pads;
providing a performance board having pads; and
providing a plurality of pogo pins with at least two pogo pins being electrically connected in parallel to one of the pads of the probe card and at least two pogo pins being electrically connected in parallel to one of the pads of the performance board.

9. The method of claim 8, wherein the pogo pins provided for electrically connecting the respective signal pads of the performance board with the respective signal pads of the probe card have the same shape and are disposed abreast one another.

10. A method of testing electrical characteristics of a semiconductor workpiece, comprising:
providing a probe card having signal pads and ground pads;
providing a performance board having signal pads and ground pads; and
providing at least two pogo pins electrically connected in parallel to the signal pads of the probe card and the signal pads of the performance board to electrically interconnect one of the signal pads of the probe card and one of the signal pads of the performance board respectively; and
providing at least one pogo pin for electrically connecting the ground pad of the probe card with the ground pad of the performance board.

* * * * *